United States Patent
Nishimura et al.

(10) Patent No.: US 6,542,038 B2
(45) Date of Patent: Apr. 1, 2003

(54) PLL CIRCUIT HAVING A PHASE OFFSET DETECTING PHASE COMPARATOR

(75) Inventors: Kazuko Nishimura, Kyoto (JP); Toru Iwata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/986,288

(22) Filed: Nov. 8, 2001

(65) Prior Publication Data

US 2002/0105389 A1 Aug. 8, 2002

(30) Foreign Application Priority Data

Feb. 6, 2001 (JP) ......................................... 2001-029204

(51) Int. Cl.[7] ................................................. H03L 7/00
(52) U.S. Cl. ............................ 331/1 A; 331/11; 331/25
(58) Field of Search ............................. 331/1 A, 14, 25, 331/11; 327/156–159, 161, 141, 142, 149, 153

(56) References Cited

U.S. PATENT DOCUMENTS 5,113,152 A * 5/1992 Norimatsu .................... 331/11
5,202,906 A * 4/1993 Saito et al. .................. 327/105
5,281,863 A * 1/1994 Bond et al. .................. 327/114
6,404,291 B1 * 6/2002 Riley ........................... 331/11

OTHER PUBLICATIONS

Ian A. Young, et al, "A PLL Clock Generator with 5 to 110MHz Lock Range for Microprocessors," Feb., 1992, ISSCC 1992 Digest of Technical Papers, pp. 50–51.

* cited by examiner

Primary Examiner—Benny Lee
Assistant Examiner—Kimberly E Glenn
(74) Attorney, Agent, or Firm—McDermott, Will & Emery

(57) ABSTRACT

A phase-offset detecting phase comparator for comparing a reference signal and an auxiliary comparison signal which is a frequency-divided VCO output in terms of a phase to detect phase offset, and producing first and second delay control signals corresponding to the phase offset; a first delay element for adding delay to the auxiliary comparison signal by the first delay control signal to produce a comparison signal; a second delay element for adding delay to the VCO output by the second delay control signal to produce a PLL output; and a dummy frequency divider for adding delay corresponding to a frequency divider to the PLL output are provided.

13 Claims, 8 Drawing Sheets

US 6,542,038 B2

PLL CIRCUIT HAVING A PHASE OFFSET DETECTING PHASE COMPARATOR

BACKGROUND OF THE INVENTION

The present invention relates to a PLL (Phase Locked Loop) circuit.

As shown in FIG. 1, a PLL circuit normally includes a phase comparator 1, a charge pump 2, an LPF (Low Pass Filter) 3, a VCO (Voltage Controlled Oscillator) 4, and a frequency divider 5. The charge pump 2 in the PLL circuit turns ON/OFF switches UP, DN between two current sources so as to charge/discharge a pump output node, thereby determining a control voltage to be applied to the VCO 4. Conventionally, however, turning ON/OFF the switches UP, DN varies a current supplied from the current sources CS1, CS2, causing variation in control voltage.

A countermeasure against this problem is disclosed in Ian A. Young et al., "A PLL Clock Generator with 5 to 110 MHz Lock Range for Microprocessors", ISSCC 1992 Digest of Technical Papers, pp. 50–51, February 1992. More specifically, as shown in FIG. 1, differential switches UP, DN, UP', DN' are provided in the charge pump 2 so that a constant current is continuously supplied from the current sources CS1, CS2. An amplifier (AMP) circuit is added in order to prevent the control voltage from varying whichever path a current flows through.

This structure achieves significant improvement in terms of the variation in control voltage. However, the offset of the AMP circuit itself causes the phase offset between a reference signal applied to the phase comparator 1 and a comparison signal, i.e., an output of the VCO 4 frequency-divided and fed back to the phase comparator 1.

Recent increase in operation speed of the PLL circuit causes an increasing demand for a PLL circuit requiring compensation of the phase relation between its input and output, such as a PLL circuit for LVDS (Low Voltage Differential Signaling) or a clock recovery circuit. Accordingly, the phase offset between the reference signal and the comparison signal that are applied to the phase comparator 1 is highly problematic. It is therefore required to find a solution of this problem.

SUMMARY OF THE INVENTION

The present invention is made in view of the foregoing problems, and it is an object of the present invention to provide a PLL circuit capable of easily detecting phase offset and also capable of reliably reducing the phase offset without increasing jitter of an output signal.

In order to achieve the above object, according to one aspect of the invention, a PLL circuit for producing an output signal synchronized with a received reference signal includes: a phase comparator for comparing the reference signal and a comparison signal with each other in terms of a phase; a charge pump for producing a control voltage from an output of the phase comparator; a low pass filter (LPF) for smoothing the control voltage; a voltage controlled oscillator (VCO) for producing an output having a frequency according to the smoothed control voltage; a phase-offset detecting phase comparator for comparing the reference signal and the output of the VCO in terms of a phase to detect phase offset, and producing first and second delay control signals corresponding to the phase offset; a first delay element for adding delay to the output of the VCO by the first delay control signal to produce the comparison signal; and a second delay element for adding delay to the output of the VCO by the second delay control signal to produce the output signal.

In order to achieve the above object, according to another aspect of the invention, a PLL circuit for producing an output signal synchronized with a received reference signal includes: a phase comparator for comparing the reference signal and a comparison signal with each other in terms of a phase; a charge pump for producing a control voltage from an output of the phase comparator; a low pass filter (LPF) for smoothing the control voltage; a voltage controlled oscillator (VCO) for producing as the output signal an output having a frequency according to the smoothed control voltage; a frequency divider having a delay control function, for dividing the output of the VCO into the comparison signal; an auxiliary frequency divider having a delay control function, for dividing the output of the VCO into an auxiliary comparison signal in the same manner as that of the frequency divider having the delay control function; and a phase-offset detecting phase comparator for comparing the reference signal and the auxiliary comparison signal with each other in terms of a phase to detect phase offset, and producing a delay control signal corresponding to the phase offset, wherein the frequency divider having the delay control function is structured such that delay is controlled by the delay control signal.

DETAILED DESCRIPTION OF THE INVENTION

Hereinafter, a PLL circuit for producing an output signal synchronized with a received reference signal will be described in connection with six embodiments of the present invention. Basically, each of the embodiments described below employs a charge pump 2 having the structure shown in FIG. 1.

(First Embodiment)

Figure 1:
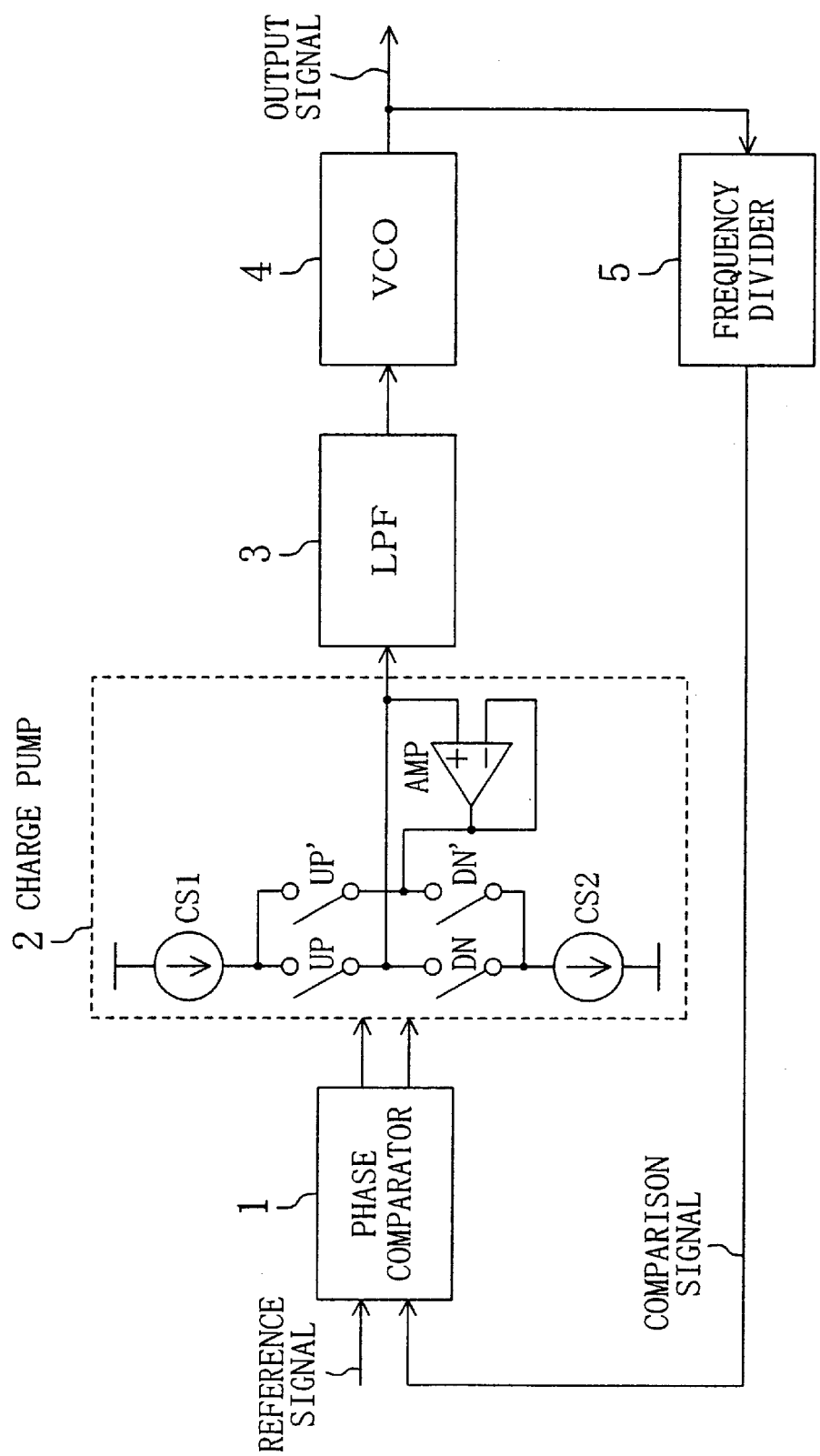
FIG. 1 is a block diagram showing an exemplary structure of a conventional PLL circuit.
Figure 2:
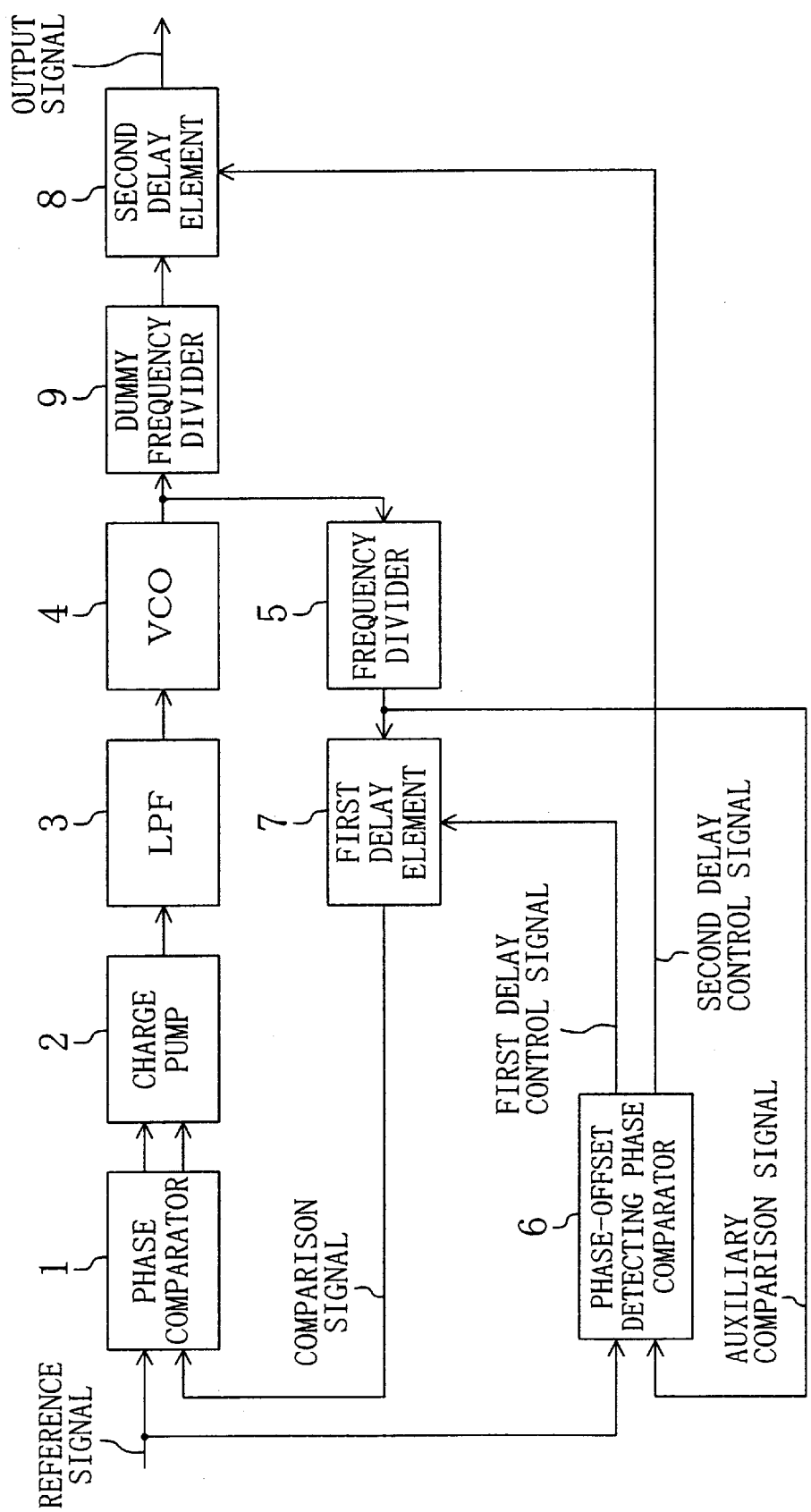
FIG. 2 is a block diagram of a PLL circuit according to a first embodiment of the present invention.

FIG. 2 shows the first embodiment of the PLL circuit. This PLL circuit includes a phase comparator 1 for comparing a reference signal and a comparison signal with each other in terms of the phase, a charge pump 2 for producing a control voltage from the output of the phase comparator 1, an LPF 3 for smoothing the control voltage, a VCO 4 for producing an output having a frequency according to the smoothed control voltage, a frequency divider 5 for dividing the output of the VCO 4 into an auxiliary comparison signal, a phase-offset detecting phase comparator 6 for comparing the reference signal and the auxiliary comparison signal with each other in terms of the phase to detect phase offset, and producing first and second delay control signals corresponding to the phase offset, a first delay element 7 for adding delay to the output of the frequency divider 5 (the auxiliary comparison signal) by the first delay control signal to produce the comparison signal, a second delay element 8 for adding delay to the output of the VCO 4 by the second delay control signal to produce the output signal, and a dummy frequency divider 9 for adding delay corresponding to the frequency divider 5 to the output signal. In other words, this PLL circuit corresponds to the conventional PLL circuit of FIG. 1 additionally including the phase-offset detecting phase comparator 6 serving as a second phase comparator, the first delay element 7, the second delay element 8 and the dummy frequency divider 9.

In addition to the fact that the phase comparator 1 forms the loop of the PLL circuit, the phase-offset detecting phase comparator 6 compares the reference signal and the auxiliary comparison signal with each other in terms of the phase to detect phase offset, and outputs the comparison result as the first and second delay control signals. It should be noted that the phase-offset detecting phase comparator 6 used herein may have the same structure as that of the phase comparator 1. Any other type of phase comparator may alternatively be used as the phase-offset detecting phase comparator 6.

The first delay element 7 and the second delay element 8 respectively receive the first and second delay control signals from the phase-offset detecting phase comparator 6. The first delay element 7 and the second delay element 8 thus add the delay to the respective signals so as to make the reference signal and the auxiliary comparison signal in phase with each other while retaining the phase relation between the reference signal and the comparison signal that are applied to the phase comparator 1. It should be note that, in the case where only one delay element is operated, the output of the VCO 4 can be adjusted in phase in only one direction (i.e., either retarded or advanced) with respect to the reference signal. The only way to adjust the phase in the opposite direction is to make the output of the VCO 4 in phase with the neighboring clock pulse. This requires additional delay corresponding to about one clock. In the present embodiment, two delay elements are provided for adding delay to different signals, respectively, so that the phase offset can be reduced in both positive and negative directions. More specifically, according to the comparison result of the phase-offset detecting phase comparator 6, the first delay element 7 is operated in order to advance the phase of the output of the VCO 4, whereas the second delay element 8 is operated in order to retard the phase of the output of the VCO 4. Thus, only the required delay corresponding to the phase offset can be added in the positive and negative directions, and no additional delay is required. Note that this structure reduces the respective delay adjustment ranges of the first delay element 7 and the second delay element 8 to half a one-clock cycle or less, enabling reduction in area of the delay elements. The AMP circuit in the charge pump 2 has a small amount of offset. Adding one-clock delay for such a small amount of offset causes increase in jitter in the delay elements. Therefore, this structure is effective also in terms of the reduced jitter.

Series-connected delay devices may be used as the first delay element 7 and the second delay element 8. Any other type of delay elements may alternatively be used as the first delay element 7 and the second delay element 8. It should be noted that the use of the delay device increases the unit delay amount of each delay element, making it difficult to adjust a small amount of offset. Therefore, it is more desirable to use a delay element having a small unit delay amount by, e.g., controlling the load of a transistor. Such a delay element having a small unit delay amount can reduce the phase offset to a value within the tolerance of the unit delay amount, enabling configuration of the PLL circuit having a well-compensated phase relation between its input and output.

The signal that is compared with the reference signal in the phase-offset detecting phase compensator 6 is the auxiliary comparison signal, i.e., the output of the VCO 4 divided by the frequency divider 5. Therefore, the dummy frequency divider 9 adds the delay corresponding to the frequency divider 5 to the output of the VCO 4 in order to make the reference signal and the output of the second delay element 8 in phase with each other. Note that, in the case where the reference signal and the output signal of the PLL circuit have the same frequency, the frequency divider 5 and the dummy frequency divider 7 are not required.

As has been described above, the structure of FIG. 2 enables configuration of the PLL circuit capable of reducing only the phase offset without generating unnecessary jitter.

(Second Embodiment)

Figure 3:
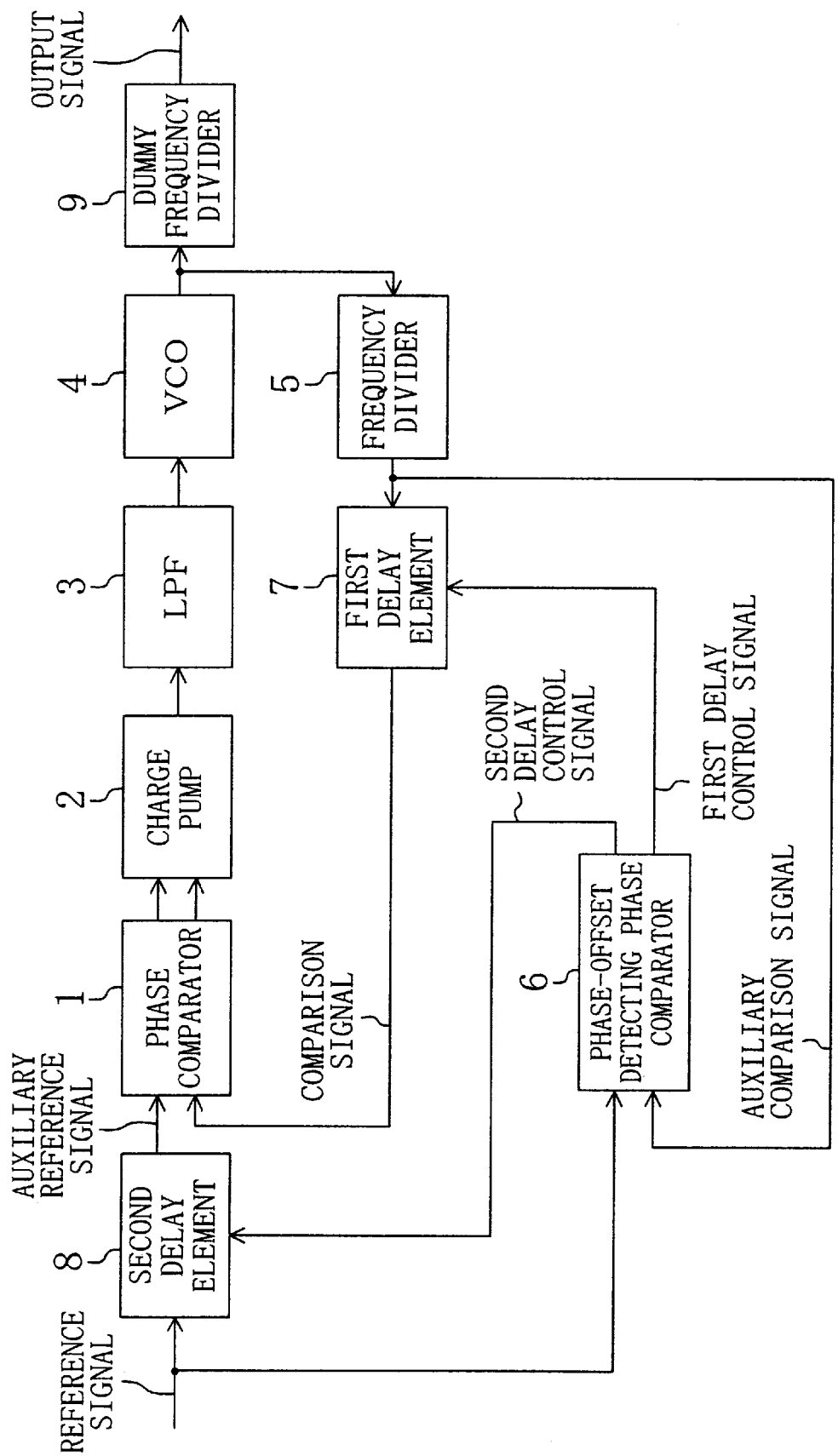
FIG. 3 is a block diagram of a PLL circuit according to a second embodiment of the present invention.

FIG. 3 shows the second embodiment of the PLL circuit. This PLL circuit is different from the first embodiment in that the second delay element 8 is added to the reference signal.

In the first embodiment, the phase relation between the reference signal and the output signal of the PLL circuit is adjusted by adding delay to the output of the VCO 4 and the auxiliary comparison signal. As in the second embodiment, the phase relation between the reference signal and the output signal of the PLL circuit can also be adjusted by adding delay to the reference signal and the auxiliary comparison signal. Thus, the same effects as those of the first embodiment can be obtained.

More specifically, in the structure of FIG. 3, the phase-offset detecting phase comparator 6 receives the reference signal and the auxiliary comparison signal. According to the phase comparison result between the reference signal and the auxiliary comparison signal, the a first delay element 7 is operated in order to retard the phase of the reference signal, whereas the second delay element 8 is operated in order to advance the phase of the reference signal. This can make the reference signal and the auxiliary comparison signal in phase with each other while retaining the phase relation between the auxiliary reference signal and the comparison signal that are applied to the phase comparator 1.

Thus, as in the first embodiment, the structure of FIG. 3 enables configuration of the PLL circuit capable of reducing only the phase offset without generating unnecessary jitter.

(Third Embodiment)

Figure 4:
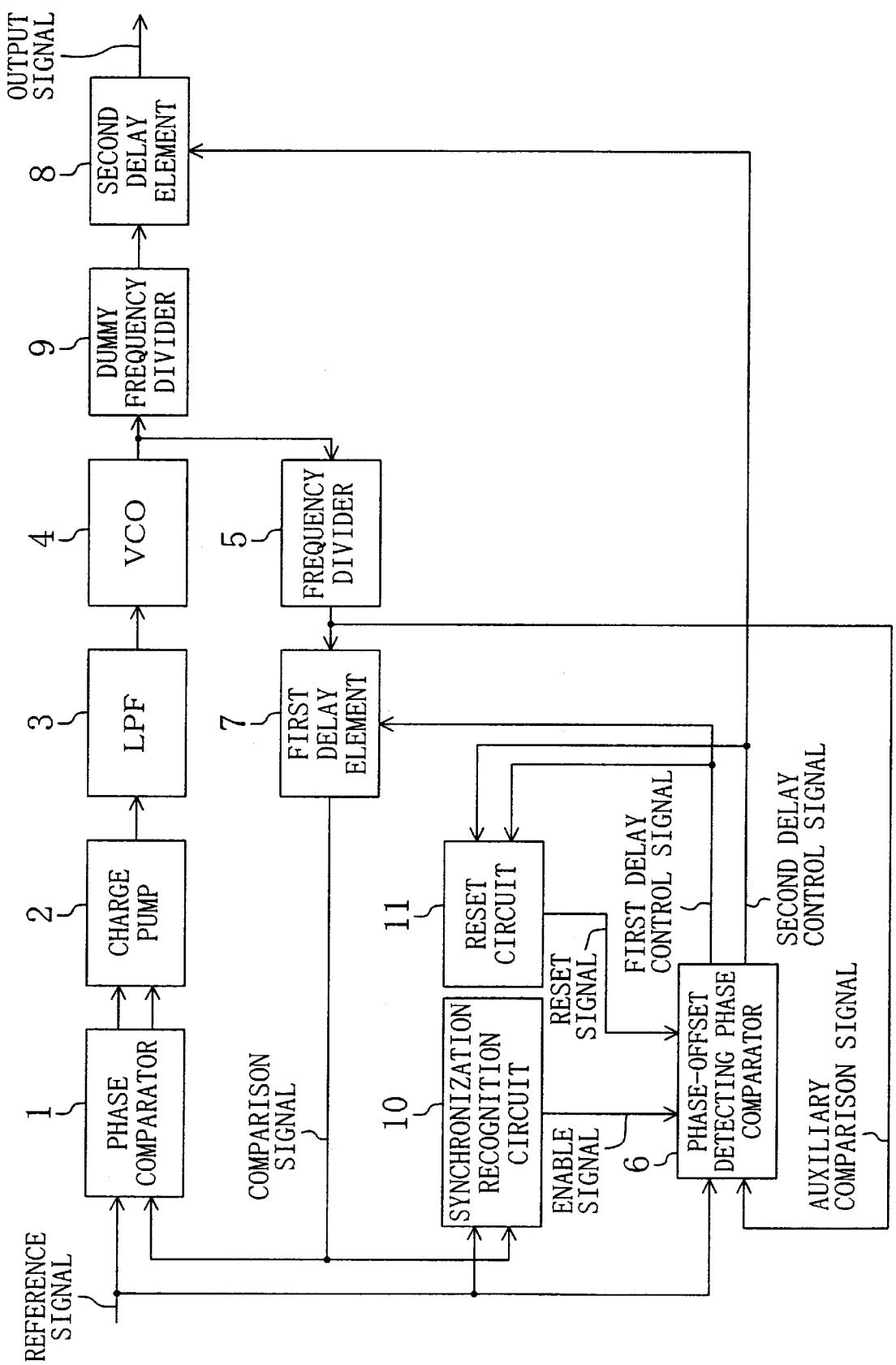
FIG. 4 is a block diagram of a PLL circuit according to a third embodiment of the present invention.

FIG. 4 shows the third embodiment of the PLL circuit. In the first embodiment, it is required for the phase-offset detecting phase comparator 6 to either continuously conduct the comparison operation, or start its operation in response to an external enable signal applied to the phase-offset detecting phase comparator 6. However, such continuous comparison operation unnecessarily increases the lock time. In addition, applying the external signal requires a special component and thus an additional external control signal.

In the third embodiment, a synchronization recognition circuit 10 is added to the structure of the first embodiment. The synchronization recognition circuit 10 outputs an enable signal to the phase-offset detecting phase comparator 6 when synchronization of the reference signal with the comparison signal is recognized a prescribed number of times, so that the phase-offset detecting phase comparator 6 can start the comparison operation. This structure enables the phase-offset detecting phase comparator 6 to start its operation by using an internal signal, i.e., without requiring an external control signal. It should be note that the synchronization recognition circuit 10 may count clocks of the reference signal and the comparison signal that are applied to the phase comparator 1, may measure the respective frequencies of the reference signal and the comparison signal, or may measure the frequency of the output signal of the PLL circuit. Alternatively, an integrator may be used to obtain variation in output of the phase comparator 1, or an integrator may be used to obtain variation in output of the charge pump 2. Any other method may be used as long as it can recognize synchronization.

In the first embodiment, the phase-offset detecting phase comparator 6 continuously compares the phase without being stopped. However, such continuous operation of the phase-offset detecting phase comparator 6 forces the first delay element 7 and the second delay element 8 to operate periodically, causing generation of unnecessary jitter due to slight lead or lag of the phase.

In the third embodiment, a reset circuit 11 is added to the structure of the first embodiment. The reset circuit 11 generates a reset signal for discontinuing operation of the phase-offset detecting phase comparator 6 when the phase difference between the reference signal and the auxiliary comparison signal that are applied to the phase-offset detecting phase comparator 6 falls within an arbitrary tolerance. With such a structure, the operation of the phase-offset detecting phase comparator 6 is discontinued after the phase offset of the PLL circuit is reduced. As a result, increase in jitter due to the operation of the first delay element 7 and the second delay element 8 can be prevented. It should be noted that the reset circuit 11 may measure the fact that the first and second delay control signals output from the phase-offset detecting phase comparator 6 are an arbitrary value or less (FIG. 4). Alternatively, a register circuit may be provided to observe the measurement result. Any other method may be used as long as it can recognize that the phase offset has been reduced to a value within an arbitrary tolerance.

(Fourth Embodiment)

Figure 5:
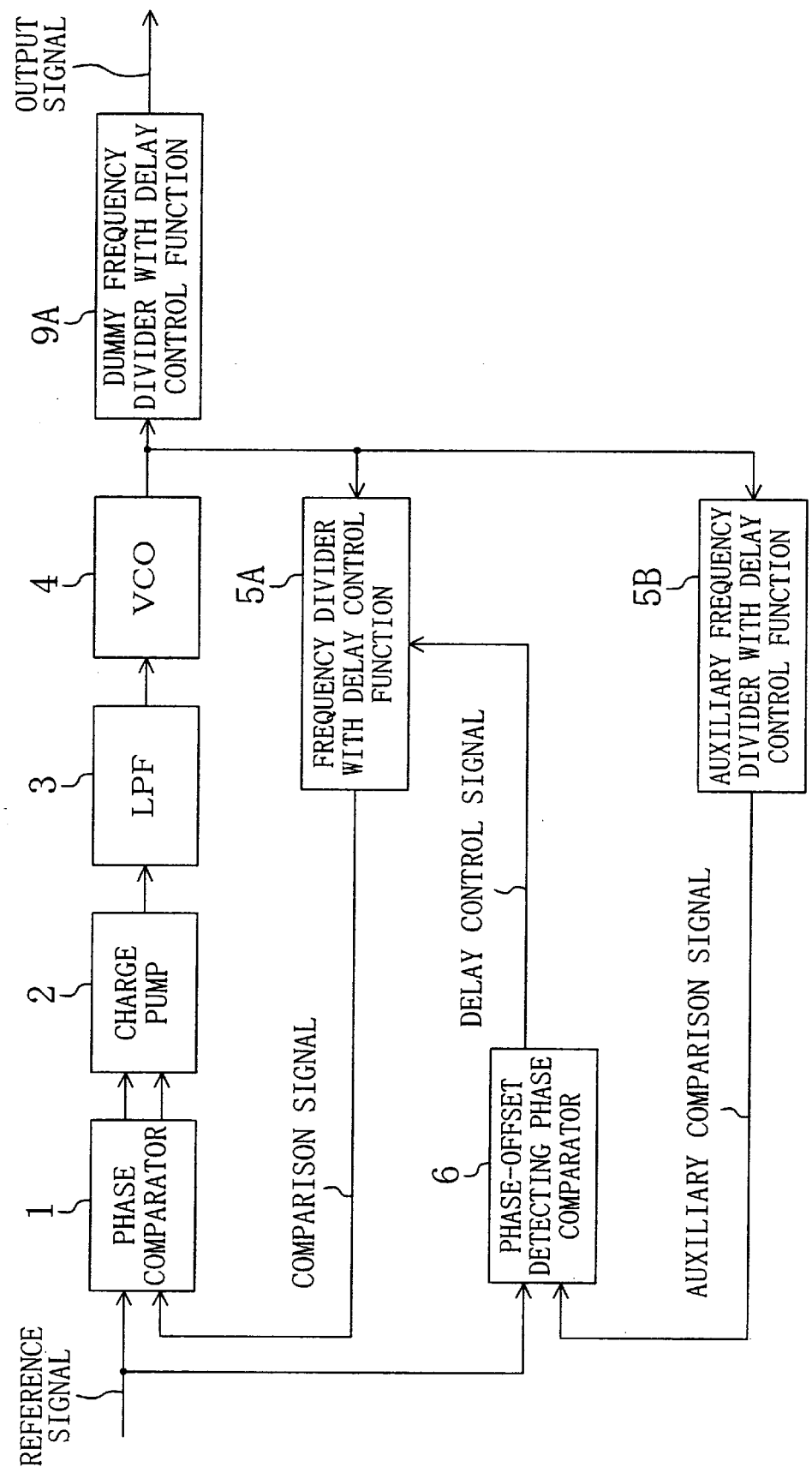
FIG. 5 is a block diagram of a PLL circuit according to a fourth embodiment of the present invention.

FIG. 5 shows the fourth embodiment of the PLL circuit. In the first embodiment, the phase offset is reduced using the delay elements. However, the phase offset of interest is a small amount of offset of the AMP circuit in the charge pump 2. Therefore, it is desirable to use a delay element having a smaller unit delay amount. In the present embodiment, an existing PLL circuit structure is used. In other words, no additional delay element is provided in order to suppress generation of jitter. Instead of providing the delay element, the internal structure of the PLL circuit is changed so as to cancel the small amount of offset.

The frequency divider 5 is replaced with a frequency divider 5A having a delay control function (hereinafter, referred to as delay-controlling frequency divider 5A). In this case, the delay is controlled within the delay-controlling frequency divider 5A. Therefore, the output of the frequency divider 5 (the auxiliary comparison signal) and the delayed signal (the comparison signal) cannot be obtained separately as in the first embodiment. An auxiliary frequency divider 5B having a delay control function (hereinafter, referred to as delay-controlling auxiliary frequency divider 5B) having the same structure as that of the delay-controlling frequency divider 5A is provided that produces an output as the auxiliary comparison signal. The phase-offset detecting phase comparator 6 receives the reference signal and the auxiliary comparison signal and feeds back the comparison result to the delay-controlling frequency divider 5A as a delay control signal. The delay-controlling frequency divider 5A and the delay-controlling auxiliary frequency divider 5B operate in the same manner until the delay control function is activated. Therefore, the comparison result between the reference signal and the auxiliary comparison signal can be regarded as being approximately the same as the phase comparison result between the reference signal and the comparison signal.

When the delay control function is activated, the phase relation between the reference signal and the comparison signal varies temporarily. Due to the loop stability of the PLL circuit, however, the phase relation therebetween is restored to the original state, and at the same time, the phase in the delay-controlling frequency divider 5A is also restored to the original state. The delay-controlling auxiliary frequency divider 5B now applies no delay. Therefore, the phase is retarded with respect to the initial state when the PLL circuit is restored to the stable point of the loop. As a result, the reference signal and the auxiliary comparison signal can be made in phase with each other.

Figure 6:
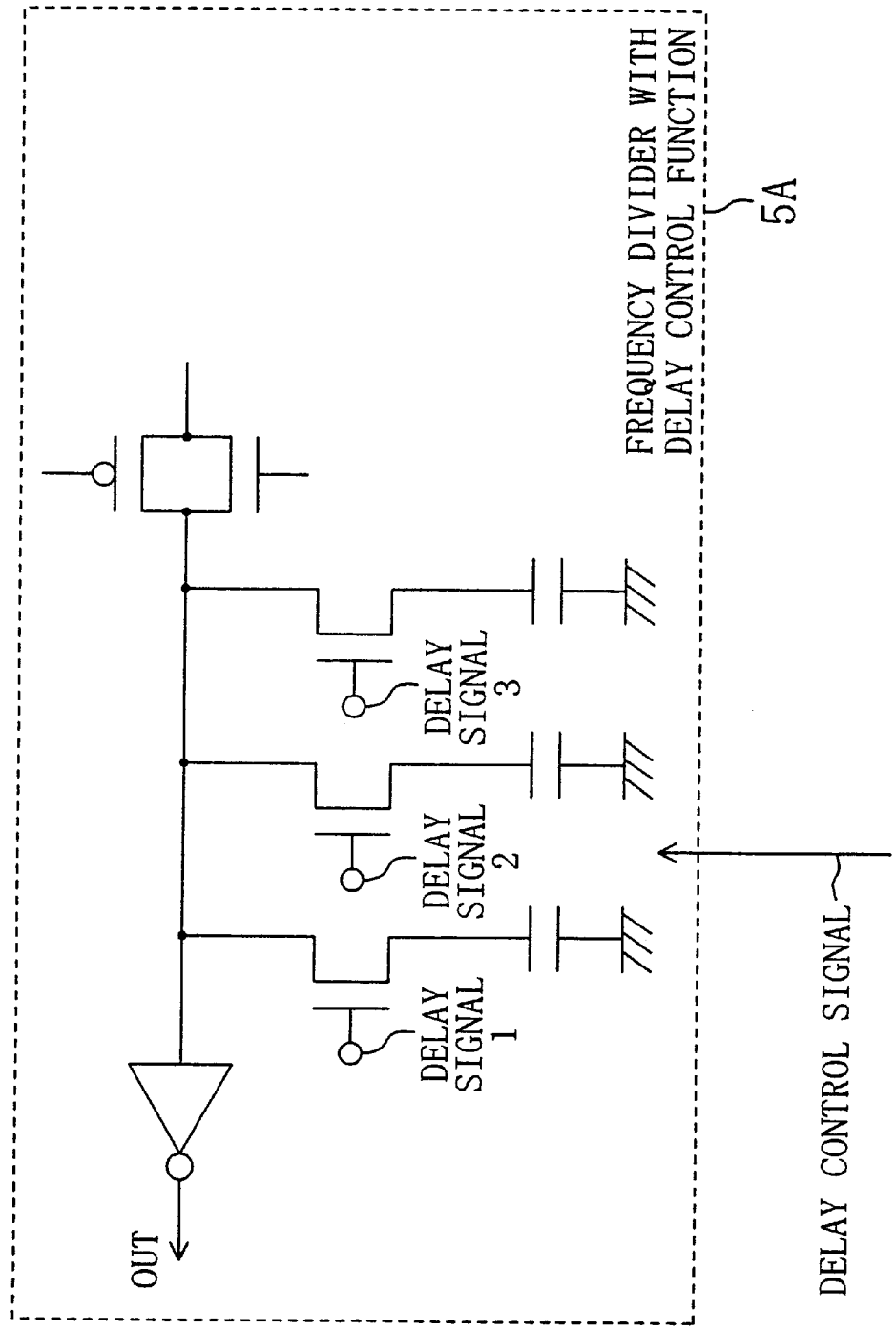
FIG. 6 is a schematic circuit diagram of a frequency divider having a delay control function shown in FIG. 5.

The delay control function of the delay-controlling frequency divider 5A and the delay-controlling auxiliary frequency divider 5B may be implemented by changing the driving capability of an output transistor (inverter or the like) within the circuit, or by changing the capacity load of a signal line by turning ON a plurality of transistors with a switch according to the delay control signal as shown in FIG. 6. Any other structure may be used as long as the delay can be applied within the frequency divider.

The fourth embodiment utilizes the loop characteristics of the PLL circuit. By using the existing PLL circuit structure, however, the fourth embodiment is capable of easily reducing the phase offset with a small area without increasing the jitter caused by an additional constituent factor. The structure using the delay element cannot reduce the delay to be added to zero, resulting in a dead band in offset cancellation. However, the present embodiment is capable of canceling the offset by, e.g., changing the transistor size of the existing circuit. Accordingly, no dead band is produced in offset cancellation.

(Fifth Embodiment)

Figure 7:
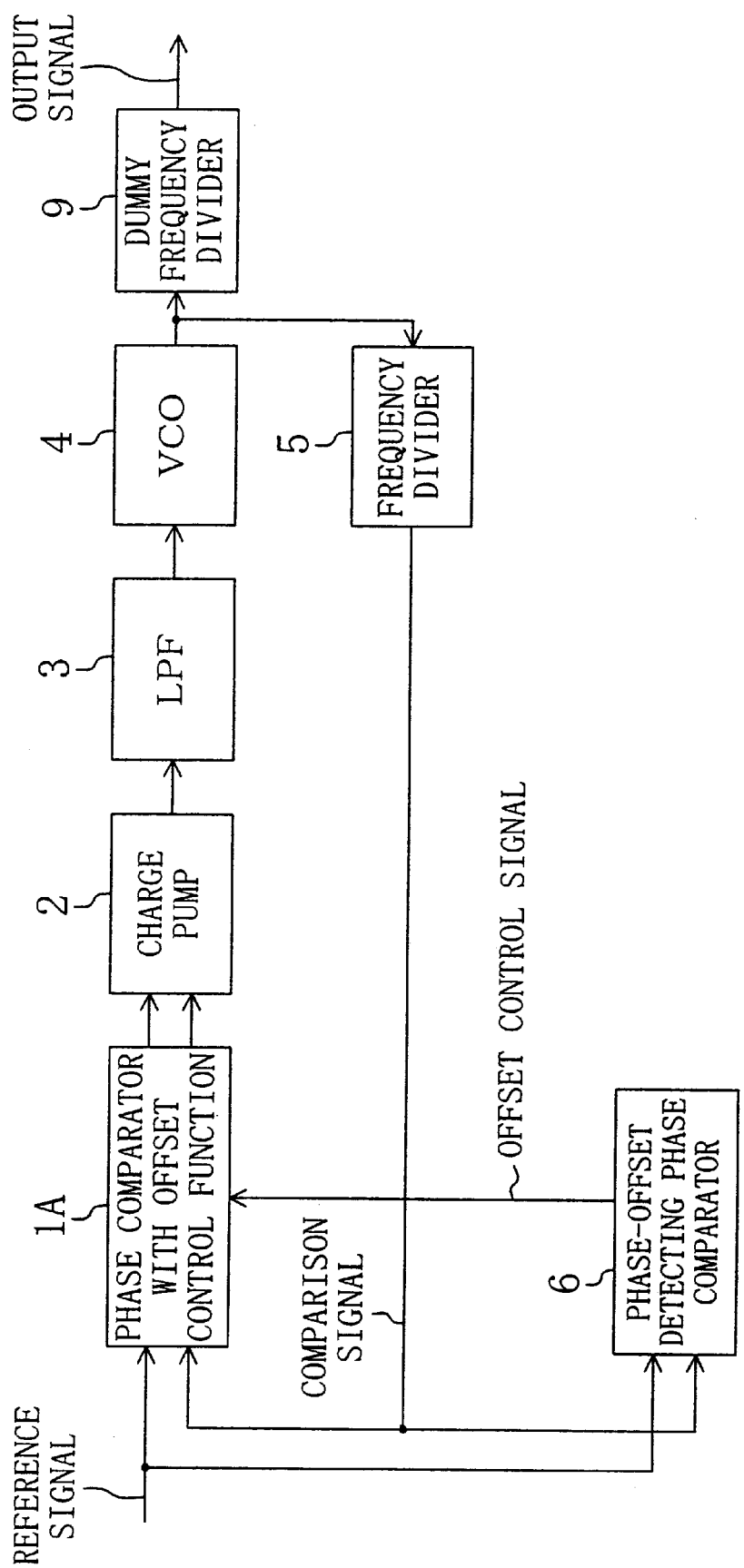
FIG. 7 is a block diagram of a PLL circuit according to a fifth embodiment of the present invention.

FIG. 7 shows the fifth embodiment of the PLL circuit. In the fifth embodiment is provided a phase comparator 1A having an offset control function (hereinafter, referred to as offset-controlling phase comparator 1A). An offset control signal is obtained from the reference signal and the comparison signal that are applied to the phase-offset detecting phase comparator 6. The offset control signal thus obtained is fed back into the offset-controlling phase comparator 1A so as to control a charge voltage and a discharge voltage of the phase comparator 1A in such a direction that cancels the phase offset, thereby enabling reduction in the phase offset between the reference signal and the comparison signal.

The offset control function in the offset-controlling phase comparator 1A may be implemented by, e.g., providing a plurality of transistors (such as NAND gates or inverters) for phase comparator output which are capable of being turned ON/OFF with a switch by the offset control signal. The offset control function may be implemented with any other circuit structure as long as the rise of the charge voltage and the discharge voltage as output can be shifted to change the control voltage of the PLL circuit.

By changing the internal structure of the PLL circuit, the fifth embodiment is capable of easily reducing the phase offset without increasing the jitter caused by an additional constituent factor, and is also capable of canceling a small amount of offset.

(Sixth Embodiment)

Figure 8:
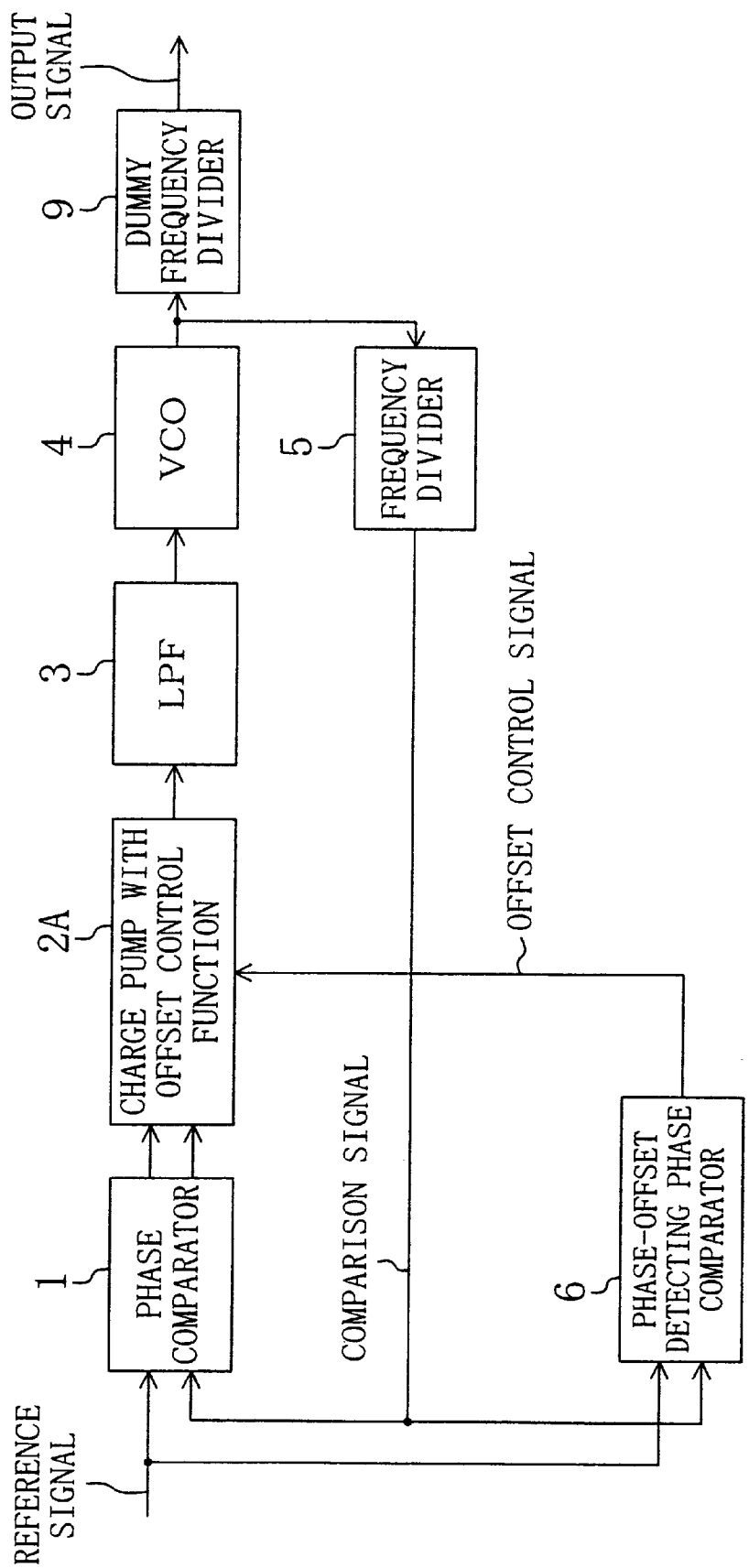
FIG. 8 is a block diagram of a PLL circuit according to a sixth embodiment of the present invention.

FIG. 8 shows the sixth embodiment of the PLL circuit. In the sixth embodiment is provided a charge pump 2A having an offset control function (hereinafter, referred to as offset-controlling charge pump 2A). An offset control signal is obtained from the reference signal and the comparison signal that are applied to the phase-offset detecting phase comparator 6. The offset control signal thus obtained is fed back into the charge pump 2A so as to control a charge voltage and a discharge voltage from the phase comparator 1 in such a direction that cancels the phase offset, thereby enabling reduction in the phase offset between the reference signal and the comparison signal.

The offset control function in the offset-controlling charge pump 2A may be implemented by, e.g., providing a plurality of transistors (such as inverters) receiving the charge voltage and the discharge voltage from the phase comparator 1 and capable of being turned ON/OFF with a switch by the offset control signal. The offset control function may be implemented with any other circuit structure as long as the rise of the internal signal can be shifted to change the control voltage of the PLL circuit.

The current balance of the current sources CS1, CS2 may be changed by, e.g., changing an external reference current value by the offset control signal, or by preparing a plurality of transistors having different sizes as the current sources CS1, CS2 so as to change the size by the offset control signal (see FIG. 1). The element causing the offset, i.e., the AMP circuit in the charge pump itself, may have an offset cancel function such as changing a bias current according to the offset control signal (see FIG. 1).

By changing the internal structure of the PLL circuit, the sixth embodiment is capable of easily reducing the phase offset without increasing the jitter caused by an additional constituent factor, and is also capable of canceling a small amount of offset.

What is claimed is:

1. A PLL circuit for producing an output signal synchronized with a received reference signal, comprising:
    a phase comparator for comparing the reference signal and a comparison signal with each other in terms of a phase;
    a charge pump for producing a control voltage from an output of the phase comparator;
    a low pass filter for smoothing the control voltage;
    a voltage controlled oscillator (VCO) for producing an output having a frequency according to the smoothed control voltage;
    a phase-offset detecting phase comparator for comparing the reference signal and the output of the VCO in terms of a phase to detect phase offset, and producing first and second delay control signals corresponding to the phase offset;
    a first delay element for adding delay to the output of the VCO by the first delay control signal to produce the comparison signal; and
    a second delay element for adding delay to the output of the VCO by the second delay control signal to produce the output signal.

2. The PLL circuit according to claim 1, further comprising:
    a frequency divider for dividing the output of the VCO into an auxiliary comparison signal and applying the auxiliary comparison signal to the phase-offset detecting phase comparator and the first delay element; and
    a dummy frequency divider for adding delay equivalent to a delay caused by the frequency divider further to the output of the VCO to produce the output signal.

3. The PLL circuit according to claim 1, wherein respective delay adjustment ranges of the first and second delay elements correspond to half a one-clock cycle or less.

4. The PLL circuit according to claim 1, wherein the second delay element adds delay to the reference signal by the second delay control signal to produce an auxiliary reference signal and applies the auxiliary reference signal to the phase comparator so that delay is added to the output of the VCO.

5. The PLL circuit according to claim 1, further comprising a synchronization recognition circuit for applying an enable signal so as to start operation of the phase-offset detecting phase comparator when the reference signal and the comparison signal are synchronized with each other.

6. The PLL circuit according to claim 1, further comprising a reset circuit for applying a reset signal so as to discontinue operation of the phase-offset detecting phase comparator when the phase offset becomes equal to or less than a prescribed value.

7. A PLL circuit for producing an output signal synchronized with a received reference signal, comprising:
    a phase comparator for comparing the reference signal and a comparison signal with each other in terms of a phase;
    a charge pump for producing a control voltage from an output of the phase comparator;
    a low pass filter for smoothing the control voltage;
    a voltage controlled oscillator (VCO) for producing as the output signal an output having a frequency according to the smoothed control voltage;
    a frequency divider having a delay control function, for dividing the output of the VCO into the comparison signal;
    an auxiliary frequency divider having a delay control function, for dividing the output of the VCO into an auxiliary comparison signal in the same manner as that of the frequency divider having the delay control function; and
    a phase-offset detecting phase comparator for comparing the reference signal and the auxiliary comparison signal with each other in terms of a phase to detect phase offset, and producing a delay control signal corresponding to the phase offset,
    wherein the frequency divider having the delay control function is structured such that delay is controlled by the delay control signal.

8. The PLL circuit according to claim 7, further comprising a dummy frequency divider having a delay control function, for adding delay corresponding to the frequency divider having the delay control function to the output signal.

9. A PLL circuit for producing an output signal synchronized with a received reference signal, comprising:

a phase comparator for comparing the reference signal and a comparison signal with each other in terms of a phase;

a charge pump for producing a control voltage from an output of the phase comparator;

a low pass filter for smoothing the control voltage;

a voltage controlled oscillator (VCO) for producing an output having a frequency according to the smoothed control voltage;

a frequency divider for dividing the output of the VCO into the comparison signal;

a dummy frequency divider for adding delay equivalent to a delay caused by the frequency divider to the output of the VCO to produce the output signal; and a phase-offset detecting phase comparator for comparing the reference signal and the comparison signal with each other in terms of a phase to detect phase offset, and producing an offset control signal corresponding to the phase offset, wherein the phase comparator or the charge pump is controlled by the offset control signal so as to reduce the phase offset.

10. The PLL circuit according to claim 9, wherein the phase comparator is structured such that a charge voltage and a discharge voltage that are to be output to the charge pump are controlled by the offset control signal.

11. The PLL circuit according to claim 9, wherein the charge pump is structured such that a charge voltage and a discharge voltage that are received from the phase comparator are controlled by the offset control signal.

12. The PLL circuit according to claim 9, wherein the charge pump is structured such that a current supplied from a current source is controlled by the offset control signal.

13. The PLL circuit according to claim 9, wherein the charge pump is structured such that a bias current of an amplifier circuit is controlled by the offset control signal.

* * * * *